(12) United States Patent
Nozawa (10) Patent No.: US 8,137,868 B2
(45) Date of Patent: Mar. 20, 2012

(54) PHOTOMASK BLANK, PHOTOMASK, AND METHODS OF MANUFACTURING THE SAME

(75) Inventor: Osamu Nozawa, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 12/725,082

(22) Filed: Mar. 16, 2010

(65) Prior Publication Data

US 2010/0173233 A1 Jul. 8, 2010

Related U.S. Application Data (62) Division of application No. 12/394,503, filed on Feb. 27, 2009.

(30) Foreign Application Priority Data

Feb. 27, 2008 (JP) ................................ 2008-046890
Jan. 27, 2009 (JP) ................................ 2009-015734

(51) Int. Cl.
G03F 1/08 (2006.01)
G03F 1/14 (2006.01)
C23C 14/08 (2006.01)
C23C 14/14 (2006.01)
C23C 14/34 (2006.01)

(52) U.S. Cl. ........ 430/4; 430/5; 204/192.26; 204/192.28

(58) Field of Classification Search ................ 430/4–5
See application file for complete search history.

(56) References Cited

U.S. PATENT DOCUMENTS

| 4,497,878 | A | 2/1985 | Hatano et al. |
| 5,989,755 | A * | 11/1999 | Shoki ................ 430/5 |
| 6,366,640 | B1 * | 4/2002 | Shoki ................ 430/5 |
| 2001/0015441 | A1 * | 8/2001 | Kawasaki et al. ........... 257/66 |
| 2004/0091789 | A1 * | 5/2004 | Han et al. ........... 430/5 |
| 2005/0208389 | A1 | 9/2005 | Ishibashi et al. |
| 2006/0008749 | A1 | 1/2006 | Sobel et al. |
| 2007/0259276 | A1 | 11/2007 | Yoshikawa et al. |
| 2008/0070128 | A1 * | 3/2008 | Wu et al. ........... 430/5 |

FOREIGN PATENT DOCUMENTS

| JP | 57-161857 A | 10/1982 |
| JP | 58-031336 A | 2/1983 |
| JP | 200624920 A | 1/2006 |
| JP | 2006-195202 A | 7/2006 |
| KR | 1020040106342 A | 12/2004 |
| KR | 1020070064612 A | 6/2007 |
| KR | 1020070114025 A | 11/2007 |

* cited by examiner

Primary Examiner — Mark F Huff
Assistant Examiner — John S Ruggles
(74) Attorney, Agent, or Firm — Sughrue Mion, PLLC (57) ABSTRACT

A photomask blank has a light-shielding film composed of at least two layers on a transparent substrate. The light-shielding film includes a light-shielding layer made of a material mainly containing tantalum nitride and further containing xenon and a front-surface antireflection layer formed on the light-shielding layer and made of a material mainly containing tantalum oxide and further containing argon.

24 Claims, 3 Drawing Sheets

PHOTOMASK BLANK, PHOTOMASK, AND METHODS OF MANUFACTURING THE SAME

This is a divisional of application Ser. No. 12/394,503 filed Feb. 27, 2009. The entire disclosure(s) of the prior application(s), application number(s) 12/394,503 is hereby incorporated by reference.

This application is based on and claims the benefit of priority from Japanese Patent Application No. 2008-046890, filed on Feb. 27, 2008, and Japanese Patent Application No. 2009-015734, filed on Jan. 27, 2009, the disclosures of which are incorporated herein in their entirety by reference.

TECHNICAL FIELD

This invention relates to a photomask blank for use as an intermediate product in manufacturing a photomask for use as a mask in, for example, transferring a fine pattern in the manufacture of semiconductor devices and to the photomask and further relates to methods of manufacturing them.

BACKGROUND ART

Generally, in the manufacture of semiconductor devices or the like, a fine pattern is formed by photolithography and, in a fine pattern transfer process where the photolithography is performed, a photomask is used as a mask. The photomask is generally obtained by forming a desired fine pattern in a light-shielding film or the like of a photomask blank as an intermediate product. Therefore, the properties of the light-shielding film or the like of the photomask blank as the intermediate product almost exactly determine the performance of the obtained photomask. Conventionally, Cr (chromium) has generally been used as the light-shielding film of the photomask blank.

In the meantime, in recent years, pattern miniaturization has advanced more and more and, following this, a problem such as resist collapse has arisen with the thickness of a conventional resist film. This will be explained hereinbelow. In the case of a light-shielding film mainly containing Cr, either wet etching or dry etching can be used as etching after forming a transfer pattern in a resist film by EB (electron beam) writing or the like. However, in the case of the wet etching, the etching tends to proceed isotropically and thus it has become difficult to cope with the recent pattern miniaturization, while, the dry etching that tends to be anisotropic has become dominant.

In dry-etching a light-shielding film mainly containing Cr, a mixed gas of a chlorine-based gas and an oxygen gas is generally used as an etching gas. However, a conventional organic resist film has properties of being easily etched with the oxygen gas and the etching rate thereof is much higher than that of the light-shielding film mainly containing Cr. Since the resist film should remain until completion of patterning, by dry etching, of the light-shielding film mainly containing Cr, the thickness of the resist film in the case of the light-shielding film mainly containing Cr is required to be very large (e.g. three times the thickness of the light-shielding film mainly containing Cr).

In recent years, the pattern miniaturization has been significant and there have been instances where, in a resist film having a transfer pattern formed by EB writing or the like, the height or thickness of the resist film is much greater than the width thereof at its portion where the pattern is dense, so that the resist film collapses or is stripped due to its instability during development or the like. If this occurs, the transfer pattern is not correctly formed in a light-shielding film mainly containing Cr, thus resulting in a defective photomask. Therefore, the reduction in thickness of the resist film has been the overriding subject to be solved. For reducing the thickness of the resist film in the case of the light-shielding film mainly containing Cr, it has been necessary to reduce the thickness of the light-shielding film. However, for the light-shielding film mainly containing Cr, its thickness has already reached a limit where the light-shielding performance becomes insufficient.

Japanese Unexamined Patent Application Publication (JP-A) No. S57-161857 (Patent Document 1) proposes a metal film mainly containing Ta (tantalum) as one of light-shielding films to be used instead of a Cr light-shielding film. Patent Document 1 discloses a mask blank having a structure in which a Ta metal layer and a mixed layer of Ta nitride (tantalum nitride) and Ta oxide (tantalum oxide) are stacked in this order on a light-transmissive substrate. Further, Japanese Unexamined Patent Application Publication (JP-A) No. S58-31336 (Patent Document 2) discloses a mask blank having a structure in which a mixed layer of metal oxide with a low oxidation degree and metal nitride with a low nitriding degree and a mixed layer of metal oxide with a high oxidation degree and metal nitride with a high nitriding degree are stacked in this order on a substrate, wherein Ta is proposed as one of metal components applicable to this structure.

On the other hand, it has been known that, in a photomask blank having a light-shielding film, a glass substrate is deformed due to film stress possessed by the light-shielding film. If the photomask blank with the deformed glass substrate is used, when a photomask is fabricated by forming a transfer pattern in the light-shielding film and is used in an exposure apparatus, there is caused optical failure such as defocus on a wafer or the like to which a pattern is transferred. When the pattern width is relatively large, this defocus is within an ignorable range. However, following the pattern miniaturization in recent years, the defocus has been becoming a problem and there have been proposed various manufacturing methods aimed at reducing the film stress being the cause of the defocus.

Japanese Unexamined Patent Application Publication (JP-A) No. 2006-195202 (Patent Document 3) proposes a manufacturing method for reducing, in a photomask blank having a Cr-based material film serving as a light-shielding film, tensile stress possessed by the Cr-based material film. Patent Document 3 discloses that when forming the Cr-based material film on a glass substrate by sputtering, the power applied to a target per unit sputtering area is set to 5 W/cm$^2$ or more.

DISCLOSURE OF THE INVENTION

Ta has started to be paid attention to as a material having higher light-shielding properties than Cr in exposure by an ArF excimer laser (wavelength: 193 nm) (hereinafter referred to as "ArF exposure") and being dry-etchable with an etching gas containing substantially no oxygen gas. Ta metal or Ta compound other than Ta oxide has an advantage of being dry-etchable only with a chlorine-based gas or a fluorine-based gas. Even in the case of Ta oxide, although substantial dry etching cannot be achieved with a chlorine-based gas because the etching rate is very low, substantial dry etching can be achieved with a fluorine-based gas. Since Ta metal or Ta compound can be dry-etched with an etching gas containing substantially no oxygen gas, the consumption amount of a resist film during dry etching can be largely reduced (dry etching is enabled with a resist film having a thickness substantially equal to that of a Ta-based light-shielding film). Accordingly, the height or thickness relative to the width of the resist film after formation of a transfer pattern by EB writing or the like can be largely reduced as compared with the case of a Cr film and thus the problem such as resist collapse or stripping can also be solved.

However, Ta metal is a material that is very easily oxidized in the atmosphere and, thus, if this is used as a light-shielding film, there arises a problem. As described above, Ta oxide can be etched only with a fluorine-based gas, but the fluorine-based gas has properties to dry-etch even a glass material such as quartz glass. Therefore, in the case where a photomask blank is fabricated by forming a Ta oxide light-shielding film on a transparent substrate of quartz glass widely used in photomask blanks for ArF exposure, there has been a problem that when a resist film is coated on the light-shielding film and then formed with a transfer pattern by EB writing or the like and then the Ta oxide light-shielding film is dry-etched with a fluorine-based gas using the patterned resist film as a mask, a pattern is accurately transferred into the Ta oxide light-shielding film, but the transparent substrate is also dry-etched with the fluorine-based gas or the surface of the transparent substrate is roughened by the fluorine-based gas, thus adversely affecting the optical properties.

Ta metal has properties such that if it is nitrided into Ta nitride, oxidation is suppressed. However, it is difficult to completely suppress the oxidation only with the nitriding. On the other hand, as the performance required for a light-shielding film, when a photomask formed with a transfer pattern is exposed with ArF exposure light or the like, the reflectance of the light reflected on a surface, remote from a transparent substrate, of the light-shielding film (the front-surface reflectance) should be set to a predetermined value or less (less than 30%). Normally, in the case of a Cr light-shielding film in a light-transmissive photomask blank, a Cr oxide layer as a front-surface antireflection layer is stacked as an upper layer on a Cr layer as a light-shielding layer with high light-shielding performance. In recent years, a hyper-NA (numerical aperture NA>1) exposure technique such as an immersion exposure technique has started to be used. In such a hyper-NA exposure technique, when exposing a photomask, the incident angle of ArF exposure light on the back surface of a transparent substrate (the surface, where a light-shielding film is not formed, of the transparent substrate) becomes large, wherein the incident angle is an angle between the light and a perpendicular of the back surface of the transparent substrate. Therefore, in the case where the light entering from the back surface of the transparent substrate and reflected at the interface between the front surface of the transparent substrate and the back surface of the light-shielding film is again reflected by the back surface of the transparent substrate and then goes out of the front surface of the transparent substrate at portions where the light-shielding film is removed, flare, dose error, or the like may occur to adversely affect pattern transfer onto an exposure object such as a resist film. In view of this, a back-surface antireflection layer is often provided between the transparent substrate and the light-shielding film. Normally, the reflectance of reflected light on the back-surface antireflection layer (the back-surface reflectance) needs to be set to less than 40%. In the case of the Cr light-shielding film, a Cr nitride layer as a back-surface antireflection layer is often interposed between the transparent substrate and the Cr layer as the light-shielding layer. As a result of a study by the present inventor in view of the above, it has been found that, in the case of a Ta light-shielding film, the film preferably has a stacked structure in which a Ta nitride layer serving as both a light-shielding layer with high light-shielding performance and a back-surface antireflection layer is formed on the transparent substrate and a Ta oxide layer serving as both a front-surface antireflection layer and an antioxidation layer for the Ta nitride layer is formed as an upper layer on the Ta nitride layer.

As described before, there has been known the problem caused by the deformation of the glass substrate due to the film stress possessed by the light-shielding film in the photomask blank having the light-shielding film, and this also applies to the case of the light-shielding film mainly containing Ta. The Ta nitride layer has a tendency that the internal compressive stress becomes high due to nitrogen being an interstitial compound and, further, since the kinetic energy when Ta particles ejected from a sputtering target impinge on the upper surface of the transparent substrate so as to be formed into a film is large due to Ta being heavier (Ta: atomic weight 180.9) than an element (Cr: atomic weight 52.00, Mo: atomic weight 95.94) conventionally used as a light-shielding film, there is a tendency that the compressive stress inside the Ta nitride layer formed as the light-shielding layer further increases.

On the other hand, the Ta oxide layer has a tendency that the internal tensile stress becomes high. However, since the kinetic energy when Ta particles ejected from the sputtering target impinge on the upper surface of the transparent substrate so as to be formed into a film is also large, a force in the compressing direction is applied to the Ta oxide layer formed as the front-surface antireflection layer and thus there is a tendency that the tensile stress inside the Ta oxide layer decreases. Normally, when a metal oxide layer having tensile stress inside is stacked as an upper layer on a metal nitride layer having compressive stress inside, stress cancellation is enabled by balancing the compressive stress and the tensile stress, for example, the stresses are cancelled by adjusting the pressure in a sputtering apparatus when forming each layer or by adjusting the power supplied to a sputtering apparatus as described in Patent Document 2, thereby minimizing the deformation amount of a transparent substrate.

However, in the case of the light-shielding film with the stacked structure of the Ta nitride layer and the Ta oxide layer, the internal compressive stress of the Ta nitride layer is much greater than the internal tensile stress of the Ta oxide layer and thus it is difficult to cancel the internal stresses of the entire light-shielding film by the conventional methods, which has been a problem.

This invention solves the problem that the optical failure such as defocus occurs when a photomask is fabricated by forming a transfer pattern in a photomask blank having a glass substrate deformed due to unbalanced internal stresses possessed by a light-shielding film mainly containing Ta and is exposed onto a pattern transfer object such as a wafer, and has an object to provide a photomask blank that enables formation of an extremely fine pattern with high accuracy, and a photomask obtained by forming the fine pattern in the photomask blank.

In order to achieve the above object, this invention has the following aspects.

(First Aspect)

There is provided a photomask blank having a light-shielding film comprising at least two layers on a transparent substrate, wherein the light-shielding film comprises:

a light-shielding layer made of a material mainly containing tantalum nitride and further containing xenon; and a front-surface antireflection layer formed on the light-shielding layer, the front-surface antireflection layer being made of a material mainly containing tantalum oxide and further containing argon.

(Second Aspect)

The light-shielding layer or the front-surface antireflection layer is preferably made of a material containing boron in the photomask blank according to the first aspect.

(Third Aspect)

There is provided a photomask wherein a transfer pattern is formed in the light-shielding film of the photomask blank according to the first aspect.

(Fourth Aspect)

There is provided a method of manufacturing a photomask blank, comprising:

forming, on a surface of a transparent substrate, a light-shielding layer made of a material mainly containing tantalum nitride, by sputtering using a sputtering target made of tantalum or a material mainly containing tantalum and using a mixed gas of a xenon gas and a nitrogen-based gas as a sputtering gas; and forming, on the light-shielding layer, a front-surface antireflection layer made of a material mainly containing tantalum oxide, by sputtering using a sputtering target made of tantalum or a material mainly containing tantalum and using a mixed gas of an argon gas and an oxygen-based gas as a sputtering gas.

(Fifth Aspect)

The sputtering target is preferably a sintered body of tantalum and boron in the method according to the fourth aspect (Sixth Aspect)

There is provided a method of manufacturing a photomask in which a transfer pattern is formed in the light-shielding film of the photomask blank according to the first aspect, comprising:

dry-etching the front-surface antireflection layer with a fluorine-based gas containing no oxygen using, as an etching mask, a resist film having the transfer pattern; and after dry-etching the front-surface antireflection layer, dry-etching the light-shielding layer with a chlorine-based gas containing no oxygen using, as an etching mask, at least one of the resist film and the front-surface antireflection layer.

In this aspect, the fluorine-based gas containing no oxygen includes what is called a fluorine-based gas containing substantially no oxygen, which contains oxygen in an amount not affecting the resist film and so on during dry etching. Further, the chlorine-based gas containing no oxygen includes what is called a chlorine-based gas containing substantially no oxygen, which contains oxygen in an amount not affecting the resist film and so on during dry etching.

According to this invention, in the manufacture of a photomask blank having, on a transparent substrate, a light-shielding film comprising a light-shielding layer mainly containing Ta nitride and a front-surface antireflection layer mainly containing Ta oxide, a mixed gas of a Xe gas and a N-based gas (nitrogen-based gas) is used as an atmospheric gas in a sputtering apparatus when forming the light-shielding layer mainly containing the Ta nitride on the transparent substrate, so that Ta particles ejected from a sputtering target of Ta metal or Ta compound in the sputtering apparatus collide with Xe atoms having a high atomic weight to lose the kinetic energy and thus can impinge on the transparent substrate in a speed-reduced state. This makes it possible to reduce a compressive force applied to the light-shielding layer mainly containing the Ta nitride upon impingement of the Ta particles and thus to largely reduce the compressive stress inside the light-shielding layer.

On the other hand, when forming the front-surface antireflection layer mainly containing the Ta oxide on the light-shielding layer, a mixed gas of an Ar gas widely used as a noble gas in sputtering and having an atomic weight lower than that of the Xe gas and an O-based gas (oxygen-based gas) is used as an atmospheric gas in the sputtering apparatus, so that even if Ta particles ejected from the sputtering target of the Ta metal or Ta compound in the sputtering apparatus collide with Ar atoms having the low atomic weight, loss of the kinetic energy is much smaller than that in the case of collision with the Xe atoms and thus the Ta particles can impinge on the transparent substrate in a state where the speed is not so reduced. This makes it possible to apply a large compressive force to the front-surface antireflection layer mainly containing the Ta oxide upon impingement of the Ta particles and thus to reduce the tensile stress inside the front-surface antireflection layer.

With the stacked structure of the light-shielding layer mainly containing the Ta nitride and largely reduced in compressive stress and the front-surface antireflection layer mainly containing the Ta oxide and reduced in tensile stress as in the case of a conventional metal oxide layer, there is an effect that the stresses of the two layers are well cancelled by each other to largely reduce the internal stress of the light-shielding film as a whole while the light-shielding film conventionally has large internal compressive stress as a whole. Accordingly, it is possible to prevent the occurrence of optical failure such as defocus that otherwise occurs when a photomask is fabricated by forming a transfer pattern in a photomask blank having a deformed glass substrate and is exposed onto a transfer object such as a wafer, and thus it is possible to provide a photomask blank satisfying the accuracy required for fine pattern exposure in recent years.

DETAILED DESCRIPTION OF THE INVENTION

Figure 1:
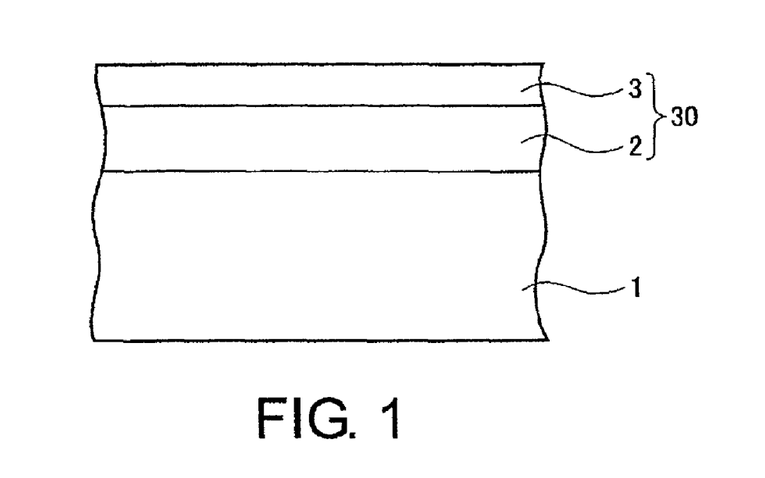
FIG. 1 is a sectional view illustrating the structure of a photomask blank according to an embodiment of this invention.
Figure 2:
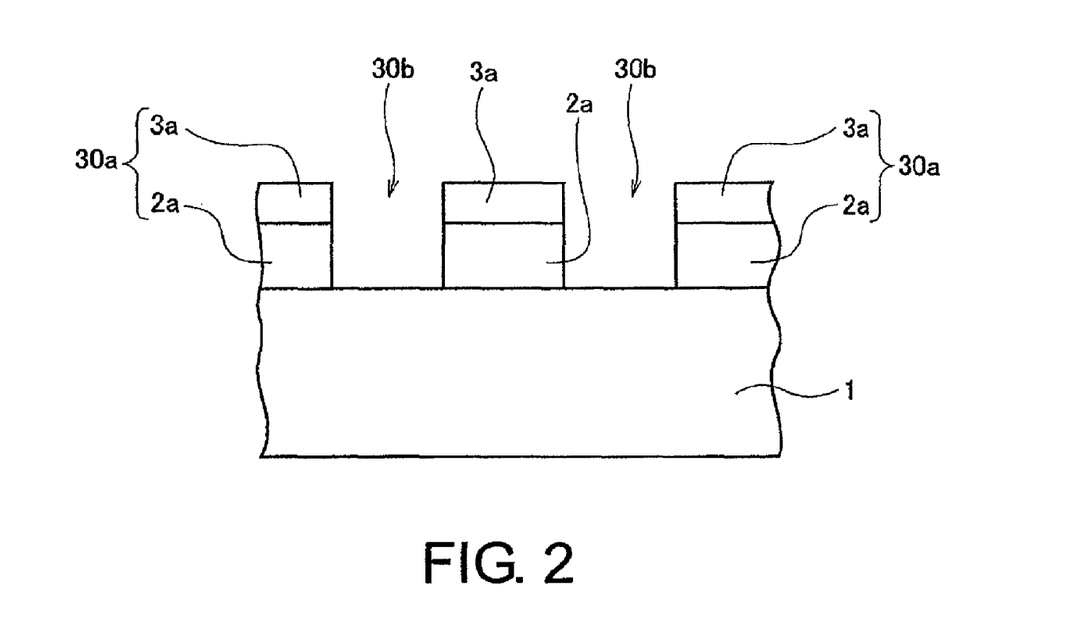
FIG. 2 is a sectional view illustrating the structure of a photomask according to the embodiment of this invention.

FIG. 1 is a sectional view illustrating the structure of a photomask blank according to an embodiment of this invention, FIG. 2 is a sectional view illustrating the structure of a photomask according to the embodiment of this invention, and FIGS. 3A to 3G are sectional views showing processes of manufacturing the photomask blank and the photomask according to the embodiment of this invention. Hereinbelow, referring to these figures, the photomask blank and the photomask according to the embodiment of this invention will be described.

As shown in FIG. 1, the photomask blank according to this embodiment is configured such that a Ta nitride layer 2 mainly containing Ta nitride and having a thickness of 44.9 nm is formed as a light-shielding layer on a glass substrate 1 made of synthetic quartz and a Ta oxide layer 3 mainly containing Ta oxide and having a thickness of 13 nm is formed as a front-surface antireflection layer on the Ta nitride layer 2. The Ta nitride layer 2 and the Ta oxide layer 3 form a light-shielding film 30. The N content of the Ta nitride layer 2 is 31 at % and the O content of the Ta oxide layer 3 is 58 at %. With this configuration of the light-shielding film 30, it is possible to set the front-surface reflectance to less than 30% and the back-surface reflectance to less than 40% with respect to ArF exposure light. As shown in FIG. 2, the photomask according to this embodiment is configured such that the light-shielding film 30 of the photomask blank shown in FIG. 1 is formed with a fine pattern comprising portions 30a where the light-shielding film 30 is left remaining and portions 30b where the light-shielding film 30 is removed.

Next, referring to FIGS. 3A to 3G, a description will be given of an Example of manufacturing the photomask blank and the photomask according to this embodiment.

EXAMPLE 1

A substrate 1 made of synthetic quartz and having an about 152 mm×152 mm square size with a thickness of 6.35 mm was introduced into a DC magnetron sputtering apparatus. After the inside of the sputtering apparatus was evacuated to 2×10$^{-5}$ (Pa) or less, a mixed gas (sputtering gas) of Xe and N$_2$ was introduced into the sputtering apparatus. In this event, the flow rate of Xe and the flow rate of N$_2$ were adjusted to 11 sccm and 15 sccm, respectively. Ta was used as a sputtering target. After the gas flow rates were stabilized, the power of a DC power supply was set to 1.5 kW, thereby forming a Ta nitride layer 2 having a thickness of 44.9 nm on the substrate 1 (see FIG. 3A).

Figure 3A:
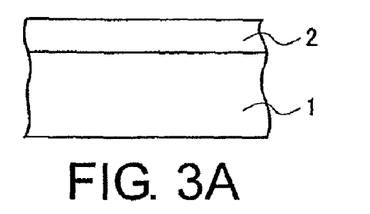
FIGS. 3A to 3G are sectional views showing processes of manufacturing the photomask blank and the photomask according to the embodiment of this invention.
Figure 3B:
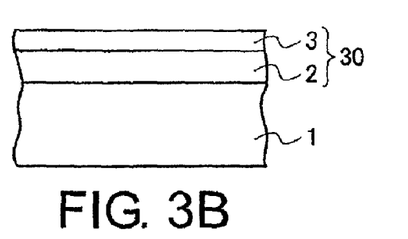
Figure 3C:
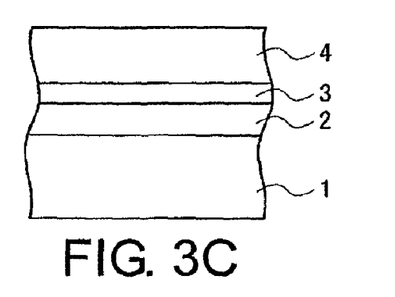

Then, while the substrate 1 formed with the Ta nitride layer 2 was maintained in the sputtering apparatus, a mixed gas (sputtering gas) containing an Ar gas at a flow rate of 58 sccm and an O$_2$ gas at a flow rate of 32.5 sccm was introduced into the sputtering apparatus and then the power of the DC power supply was set to 0.7 kW, thereby stacking a Ta oxide layer 3 having a thickness of 13 nm on the Ta nitride layer 2 (see FIG. 3B). When forming the Ta oxide layer 3 by DC magnetron sputtering, it may happen that an oxide film is deposited on the sputtering target to reduce the film forming rate. For suppressing the reduction in film forming rate, a DC pulse unit is effective. In this Example, use was made of Sparc-LE V (trade name) manufactured by Advanced Energy Industries, Inc.

The reflectance (front-surface reflectance) of a surface, remote from the substrate 1, of a light-shielding film 30 of a photomask blank thus fabricated was 19.5% for ArF exposure light (wavelength: 193 nm). The reflectance (back-surface reflectance) of a surface, where the light-shielding film 30 was not formed, of the substrate 1 was 30.3% for ArF exposure light. Further, the transmittance for ArF exposure light was 0.1%. Values of refractive index n and extinction coefficient k were calculated using n&k 1280 (trade name), an optical thin-film property measuring apparatus, manufactured by n&k Technology, Inc., wherein the refractive index n and the extinction coefficient k of the Ta nitride layer 2 were 2.16 and 2.02, respectively, and the refractive index n and the extinction coefficient k of the Ta oxide layer 3 were 2.23 and 1.09, respectively. Further, XPS (X-ray photoelectron spectroscopy) analysis was performed for a light-shielding film 30 formed in the same manner, wherein the N content and the Xe content of the Ta nitride layer 2 were 31 at % and about 0.4 at %, respectively, and the O content of the Ta oxide layer 3 was 58 at %. Further, RBS (Rutherford Backscattering Spectrometry) analysis was performed and the Ar content in the Ta oxide layer 3 was about 2 at %. Further, the surface roughness in a 1 μm square area of the light-shielding film 30 was measured using an AFM (atomic force microscope) and the value of Rms was 0.49 nm. Further, defect inspection was conducted using M1350 (trade name), a defect inspection apparatus, manufactured by Lasertec Corporation and it was confirmed that it was possible to identify defects normally.

The film structure, the manufacturing conditions, and so on of the photomask blank according to Example 1 are collectively shown in Table 1.

TABLE 1

| Configuration of Example 1 | Material | Thickness (nm) | Introduced Gas during Sputtering | | | |
|---|---|---|---|---|---|---|
| | | | Xe (sccm) | Ar (sccm) | N$_2$ (sccm) | O$_2$ (sccm) |
| Front-Surface Antireflection Layer | Ta—O | 13 | 0 | 58 | 0 | 32.5 |
| Light-Shielding Layer | Ta—N | 44.9 | 11 | 0 | 15 | 0 |

Further, the optical properties and so on of the photomask blank according to Example 1 are collectively shown in Table 2.

TABLE 2

| Properties of Example 1 | Optical Properties | | | | | Composition | | Surface |
|---|---|---|---|---|---|---|---|---|
| | Front-Surface Reflectance | Back-Surface Reflectance | n | k | Transmittance | N Content (at %) | O Content (at %) | Roughness Rms (nm) |
| Front-Surface Antireflection Layer | 19.5% | 30.3% | 2.23 | 1.09 | 0.1% | 0 | 58 | 0.49 |
| Light-Shielding Layer | | | 2.16 | 2.02 | | 31 | 0 | |

With respect to the photomask blank thus fabricated, the deformation amount of the substrate 1 in the cross-sectional direction was measured before and after the formation of the light-shielding film 30. The measurement of the deformation amount of the substrate 1 was performed in a 142 mm square area excluding the outer peripheral portion of the 152 mm square substrate 1. As a result, the upper surface of the substrate 1 was deformed by 0.02 μm in a convex direction due to the formation of the light-shielding film 30.

Figure 3D:
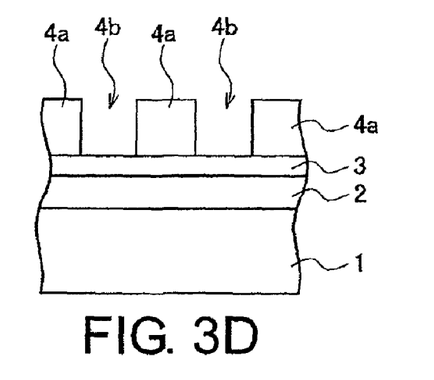

Then, an electron-beam resist 4 was coated to a thickness of 150 nm on the Ta oxide layer 3 of the light-shielding film 30 formed on the substrate 1 (see FIG. 3C) and then EB writing and development were carried out, thereby forming a resist pattern (see FIG. 3D). In FIG. 3D, symbols 4a and 4b respectively denote resist remaining portions and resist removed portions after the development and the resist pattern is formed by the resist remaining portions 4a and the resist removed portions 4b.

Figure 3E:
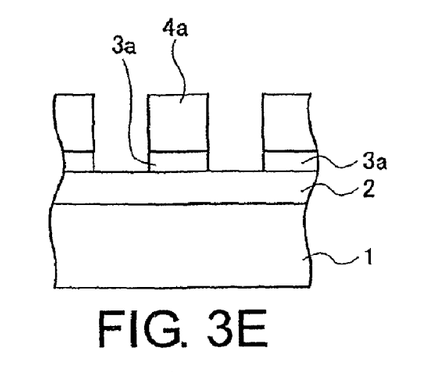
Figure 3F:
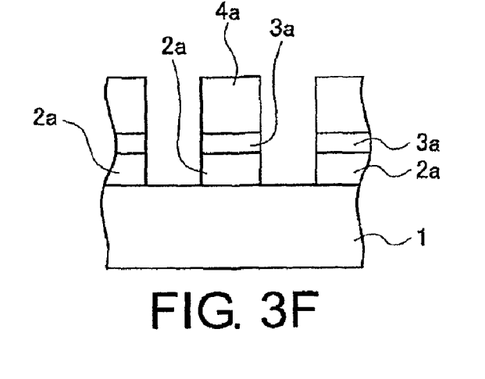
Figure 3G:
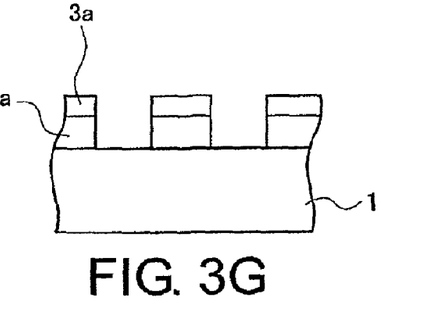

Then, dry etching using a $CHF_3$ gas was carried out, thereby forming a pattern of the Ta oxide layer 3 (see FIG. 3E). In FIG. 3E, symbol 3a denotes Ta oxide layer remaining portions in the pattern of the Ta oxide layer 3. Subsequently, dry etching using a $Cl_2$ gas was carried out, thereby forming a pattern of the Ta nitride layer 2. Further, 30% additional etching was carried out, thereby forming a light-shielding film pattern on the substrate 1 (see FIG. 3F). In FIG. 3F, symbol 2a denotes Ta nitride layer remaining portions in the pattern of the Ta nitride layer 2. SEM cross-section observation was carried out for the light-shielding film pattern thus formed, wherein the electron-beam resist remained with a thickness of about 80 nm. Then, the resist on the light-shielding film pattern was removed, thereby obtaining a light-shielding film pattern as a photomask pattern (see FIG. 3G). A photomask thus fabricated was set in an exposure apparatus to thereby carry out pattern transfer onto a wafer coated with a resist. As a result, the transferred pattern offset amount from a design pattern on the resist of the wafer due to defocus or the like satisfied the accuracy required for half-pitch 32 nm or less fine pattern exposure. Thus, it has been found that the photomask blank of Example 1 has sufficient performance in half-pitch 32 nm or less fine pattern exposure.

COMPARATIVE EXAMPLE 1

A light-shielding film was formed in the same manner as in Example 1 except that, for confirming the effect of using the mixed gas of Xe and $N_2$ as the sputtering gas in sputtering the Ta nitride layer 2 in Example 1, a Ta nitride layer 2 was sputtered using a mixed gas of Ar and $N_2$ as a sputtering gas, which being a conventional manufacturing method.

After the inside of the sputtering apparatus was evacuated to $2 \times 10^{-5}$ (Pa) or less, a mixed gas (sputtering gas) of Ar and $N_2$ was introduced into the sputtering apparatus. In this event, the flow rate of Ar and the flow rate of $N_2$ were adjusted to 30 sccm and 20 sccm, respectively. Ta was used as a sputtering target. After the gas flow rates were stabilized, the power of the DC power supply was set to 1.5 kW, thereby forming a Ta nitride layer 2 having a thickness of 44.2 nm on a substrate 1. Then, while the substrate 1 formed with the Ta nitride layer 2 was maintained in the sputtering apparatus, a Ta oxide layer 3 having a thickness of 13 nm was stacked on the Ta nitride layer 2 under the same conditions as in Example 1.

The reflectance (front-surface reflectance) of a surface, remote from the substrate 1, of a light-shielding film 30 of a photomask blank thus fabricated was 19.6% for ArF exposure light. The reflectance (back-surface reflectance) of a surface, where the light-shielding film 30 was not formed, of the substrate 1 was 30.4% for ArF exposure light. Further, the transmittance for ArF exposure light was 0.1%. Values of refractive index n and extinction coefficient k were calculated using n&k 1280 (trade name) manufactured by n&k Technology, Inc., wherein the refractive index n and the extinction coefficient k of the Ta nitride layer 2 were 220 and 2.05, respectively, and the refractive index n and the extinction coefficient k of the Ta oxide layer 3 were 2.23 and 1.09, respectively. Further, XPS analysis was performed for a light-shielding film 30 formed in the same manner, wherein the N content of the Ta nitride layer 2 was 32 at % and the O content of the Ta oxide layer 3 was 58 at %. Further, the surface roughness in a 1 μm square area of the light-shielding film 30 was measured using the AFM and the value of Rms was 0.28 nm. Further, defect inspection was conducted using M1350 (trade name) manufactured by Lasertec Corporation and it was confirmed that it was possible to identify defects normally. The manufacturing conditions and so on of Comparative Example 1 are collectively shown in Table 3.

TABLE 3

| Configuration of Comparative Example 1 | Material | Thickness (nm) | Introduced Gas during Sputtering | | |
|---|---|---|---|---|---|
| | | | Ar (sccm) | $N_2$ (sccm) | $O_2$ (sccm) |
| Front-Surface Antireflection Layer | Ta—O | 13 | 58 | 0 | 32.5 |
| Light-Shielding Layer | Ta—N | 44.2 | 30 | 20 | 0 |

Further, the optical properties and so on of the photomask blank according to Comparative Example 1 are collectively shown in Table 4.

TABLE 4

| Properties of Comparative Example 1 | Optical Properties | | | | | Composition | | Surface |
|---|---|---|---|---|---|---|---|---|
| | Front-Surface Reflectance | Back-Surface Reflectance | n | k | Transmittance | N Content (at %) | O Content (at %) | Roughness Rms (nm) |
| Front-Surface Antireflection Layer | 19.6% | 30.4% | 2.23 | 1.09 | 0.1% | 0 | 58 | 0.28 |
| Light-Shielding Layer | | | 2.20 | 2.05 | | 32 | 0 | |

With respect to the photomask blank thus fabricated, the deformation amount of the substrate 1 in the cross-sectional direction was measured before and after the formation of the light-shielding film 30 in the same manner as in Example 1. As a result, the upper surface of the substrate 1 was largely deformed by 0.56 μm in a convex direction due to the formation of the light-shielding film 30.

Then, a light-shielding film pattern was formed in the same manner as in Example 1, thereby obtaining a photomask. The photomask thus obtained was set in the exposure apparatus to thereby carry out pattern transfer onto a wafer coated with a resist. As a result, a transferred pattern was largely offset from a design pattern on the resist of the wafer due to defocus or the like caused by the large deformation of the substrate and thus it was not possible to satisfy the accuracy required for half-pitch 32 nm or less fine pattern exposure.

It is generally known that the film stress also changes depending on the pressure in the sputtering apparatus during sputtering. Herein, the flow rate of a gas introduced as a noble gas in sputtering a Ta nitride layer was changed (this causes the pressure in the sputtering apparatus to change) to verify the relationship between the pressure in the sputtering apparatus and the deformation amount of a glass substrate (a quartz glass substrate made of the same material as that in Example 1 and Comparative Example 1) for the cases where the noble gas was an Ar gas and where the noble gas was a Xe gas. Since this verification was mainly aimed to examine the influence of film stress of a Ta nitride layer on a glass substrate, only the Ta nitride layer was formed on the glass substrate and thus a Ta oxide layer was not formed.

At first, verification was performed for the case where a mixed gas (sputtering gas) of Ar and $N_2$ was used in sputtering a Ta nitride layer of Comparative Example 1. Except that the introduction flow rate of the Ar gas was changed, Ta nitride layers were sputtered under the same conditions as in Comparative Example 1 (the introduction flow rate of the $N_2$ gas was maintained constant at 20 sccm). The results are shown in Table 5.

TABLE 5

| Ar Gas Flow Rate (sccm) | Substrate Deformation Direction | Substrate Deformation Amount (μm) | Thickness (nm) | Substrate Deformation Amount per Unit Thickness (μm/nm) | Film Forming Pressure (Pa) |
|---|---|---|---|---|---|
| 20 | convex | 0.66 | 39.78 | 0.0166 | 0.06 |
| 30 | convex | 0.65 | 44.20 | 0.0147 | 0.10 |
| 60 | convex | 0.63 | 46.41 | 0.0136 | 0.19 |
| 100 | convex | 0.58 | 48.62 | 0.0119 | 0.32 |

The substrate deformation direction in Table 5 represents "concave or convex" with respect to the upper surface side of the glass substrate. Since it is difficult to obtain a constant thickness of the Ta nitride layers in view of the specification of the sputtering apparatus, the relationship between the substrate deformation amount and the film forming pressure (the pressure in the sputtering apparatus during film formation) is shown by converting a substrate deformation amount to a substrate deformation amount per unit thickness obtained by dividing the substrate deformation amount by the thickness. The film forming condition of Ar gas flow rate 30 sccm in Table 5 is the same as that in Comparative Example 1. This means that, in Comparative Example 1, the Ta nitride layer had compressive stress adapted to deform the glass substrate by 0.65 μm in the convex direction. In Comparative Example 1, the glass substrate was deformed by 0.56 μm in the convex direction as a result of stacking the Ta oxide layer on the Ta nitride layer and, therefore, the Ta oxide layer with the thickness of 13 nm formed under the film forming conditions of Comparative Example 1 had tensile stress adapted to restore the glass substrate by 0.09 μm (substrate deformation amount per unit thickness: 0.0069 μm/nm) in the concave direction against the compressive stress of the Ta nitride layer. As a result of this verification, it has been found that even by adjusting the introduction flow rate of the Ar gas into the sputtering apparatus, it is difficult for the tensile stress of the Ta oxide layer to cancel the compressive stress of the Ta nitride layer so as to reduce the deformation amount of the glass substrate to satisfy the accuracy required for half-pitch 32 nm or less fine pattern exposure.

Subsequently, verification was performed for the case where a mixed gas (sputtering gas) of Xe and $N_2$ was used in sputtering a Ta nitride layer of Example 1. Except that the introduction flow rate of the Xe gas was changed, Ta nitride layers were sputtered under the same conditions as in Example 1 (the introduction flow rate of the $N_2$ gas was maintained constant at 15 sccm). The results are shown in Table 6.

TABLE 6

| Xe Gas Flow Rate (sccm) | Substrate Deformation Direction | Substrate Deformation Amount (μm) | Thickness (nm) | Substrate Deformation Amount per Unit Thickness (μm/nm) | Film Forming Pressure (Pa) |
|---|---|---|---|---|---|
| 9 | convex | 0.20 | 40.86 | 0.0049 | 0.06 |
| 11 | convex | 0.11 | 44.90 | 0.0024 | 0.07 |
| 20 | concave | 0.26 | 46.70 | 0.0056 | 0.14 |
| 40 | concave | 0.07 | 48.49 | 0.0014 | 0.29 |

The film forming condition of Xe gas flow rate 11 sccm in Table 6 is the same as that in Example 1. As is clear from a comparison with the results of Table 5, it is seen that the compressive stress of the Ta nitride layer that deforms the glass substrate can be largely reduced by the use of the Xe gas. Further, it is seen that, in Example 1, the Ta nitride layer had compressive stress adapted to deform the glass substrate by 0.11 μm in the convex direction. In Example 1, the glass substrate was deformed by 0.02 μm in the convex direction as a result of stacking the Ta oxide layer on the Ta nitride layer and, therefore, the Ta oxide layer with the thickness of 13 nm formed under the film forming conditions of Example 1 had tensile stress adapted to restore the glass substrate by 0.09 μm (substrate deformation amount per unit thickness: 0.0069 μm/nm) in the concave direction against the compressive stress of the Ta nitride layer. As a result of this verification, it has been found that, by using the Xe gas as a noble gas of the sputtering gas (gas introduced during sputtering), the compressive stress of the Ta nitride layer can be largely reduced and, further, by adjusting the introduction flow rate of the Xe gas into the sputtering apparatus to make a balance with the tensile stress of the Ta oxide layer, the deformation amount of the glass substrate can be further reduced and thus it is possible to fabricate a mask blank that can satisfy the accuracy required for half-pitch 32 nm or less fine pattern exposure.

EXAMPLE 2

Figure 4:
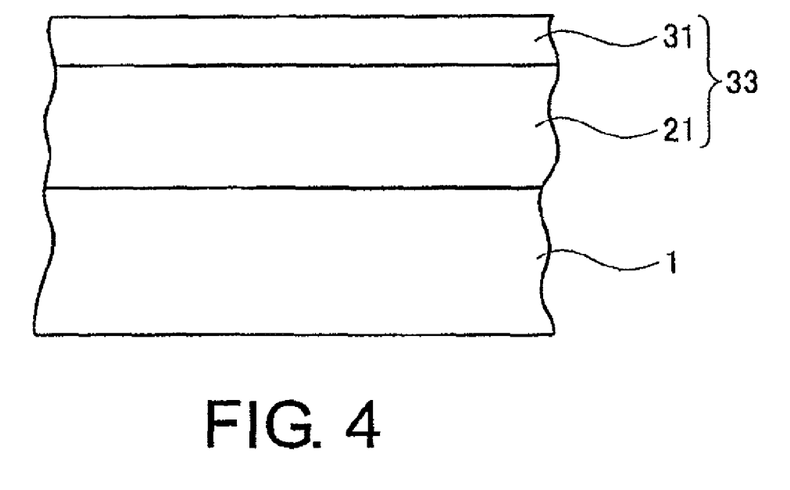
FIG. 4 is a sectional view illustrating the structure of a photomask blank according to Example 2 of this invention.

FIG. 4 is a sectional view illustrating the structure of a photomask blank according to Example 2. As shown in FIG. 4, the photomask blank according to Example 2 is configured such that a Ta—B—N layer 21 having a thickness of 46.7 nm is formed as a light-shielding layer on a glass substrate 1 made of synthetic quartz and a Ta—B—O layer 31 having a thickness of 10 nm is formed as a front-surface antireflection layer on the Ta—B—N layer 21. The Ta—B—N layer 21 and the Ta—B—O layer 31 form a light-shielding film 33. Herein, the N content of the Ta—B—N layer 21 is 15 at % and the O content of the Ta—B—O layer 31 is 58 at %.

The photomask blank according to Example 2 is manufactured in the following manner: As in Example 1, a substrate 1 made of synthetic quartz and having an about 152 mm×152 mm square size with a thickness of 6.35 mm was introduced into a DC magnetron sputtering apparatus. After the inside of the sputtering apparatus was evacuated to $2 \times 10^{-5}$ (Pa) or less, a mixed gas (sputtering gas) of Xe and $N_2$ was introduced into the sputtering apparatus. In this event, the flow rate of Xe and the flow rate of $N_2$ were adjusted to 12.9 sccm and 6 sccm, respectively. A Ta—B alloy (Ta:B=80:20 atomic ratio) was used as a sputtering target. After the gas flow rates were stabilized, the power of a DC power supply was set to 1.5 kW, thereby forming a Ta—B—N layer 21 having a thickness of 46.7 nm on the substrate 1.

Then, while the substrate 1 formed with the Ta—B—N layer 21 was maintained in the sputtering apparatus, a mixed gas (sputtering gas) containing Ar at a flow rate of 58 sccm and $O_2$ at a flow rate of 32.5 sccm was introduced into the sputtering apparatus and then the power of the DC power supply was set to 0.7 kW, thereby stacking a Ta—B—O layer 31 having a thickness of 10 nm on the Ta—B—N layer 21. When forming the Ta—B—O layer 31 by DC magnetron sputtering, it may happen that, as in the case of the Ta oxide layer 3, an oxide film is deposited on the sputtering target to reduce the film forming rate. For suppressing the reduction in film forming rate, a DC pulse unit is effective. Also in this Example, use was made of Sparc-LE V (trade name) manufactured by Advanced Energy Industries, Inc.

The reflectance (front-surface reflectance) of a surface, remote from the substrate 1, of a light-shielding film 33 thus formed was 18.1% for ArF exposure light. The reflectance (back-surface reflectance) of a surface, where the light-shielding film 33 was not formed, of the substrate 1 was 33.7% for ArF exposure light. Further, the transmittance for ArF exposure light was 0.1%. XPS analysis was performed for a light-shielding film 33 formed in the same manner, wherein the N content and the Xe content of the Ta—B—N layer 21 were 15 at % and about 0.3 at %, respectively, and the O content of the Ta—B—O layer 31 was 58 at %. Further, RBS analysis was performed and the Ar content in the Ta—B—O layer 31 was about 1 at %. Further, the surface roughness in a 1 μm square area of the light-shielding film 33 was measured using an AFM and the value of Rms was 0.42 nm.

The manufacturing conditions and so on of Example 2 are collectively shown in Table 7.

TABLE 7

| Configuration of Example 2 | Material | Thickness (nm) | Introduced Gas during Sputtering | | | |
|---|---|---|---|---|---|---|
| | | | Xe (sccm) | Ar (sccm) | $N_2$ (sccm) | $O_2$ (sccm) |
| Front-Surface Antireflection Layer | Ta—B—O | 10 | 0 | 58 | 0 | 32.5 |
| Light-Shielding Layer | Ta—B—N | 46.7 | 12.9 | 0 | 6 | 0 |

Further, the optical properties and so on of the photomask blank according to Example 2 are collectively shown in Table 8.

TABLE 8

| Properties of Example 2 | Optical Properties | | | | | Composition | | Surface |
|---|---|---|---|---|---|---|---|---|
| | Front-Surface Reflectance | Back-Surface Reflectance | n | k | Transmittance | N Content (at %) | O Content (at %) | Roughness Rms (nm) |
| Front-Surface Antireflection Layer | 18.1% | 33.7% | 2.23 | 1.09 | 0.1% | 0 | 58 | 0.42 |
| Light-Shielding Layer | | | 1.88 | 2.05 | | 15 | 0 | |

With respect to the photomask blank thus fabricated, the deformation amount of the substrate 1 in the cross-sectional direction was measured before and after the formation of the light-shielding film 33. The measurement of the deformation amount of the substrate 1 was performed in a 142 mm square area excluding the outer peripheral portion of the 152 mm square substrate 1. As a result, the upper surface of the substrate 1 was deformed by 0.01 μm in the convex direction due to the formation of the light-shielding film 33.

Then, a light-shielding film pattern was formed in the same manner as in Example 1, thereby obtaining a photomask. The photomask thus obtained was set in an exposure apparatus to thereby carry out pattern transfer onto a wafer coated with a resist. As a result, the transferred pattern offset amount from a design pattern on the resist of the wafer due to defocus or the like satisfied the accuracy required for half-pitch 32 nm or less fine pattern exposure. Thus, it has been found that the photomask blank of Example 2 has sufficient performance in half-pitch 32 nm or less fine pattern exposure.

EXAMPLE 3

Figure 5:
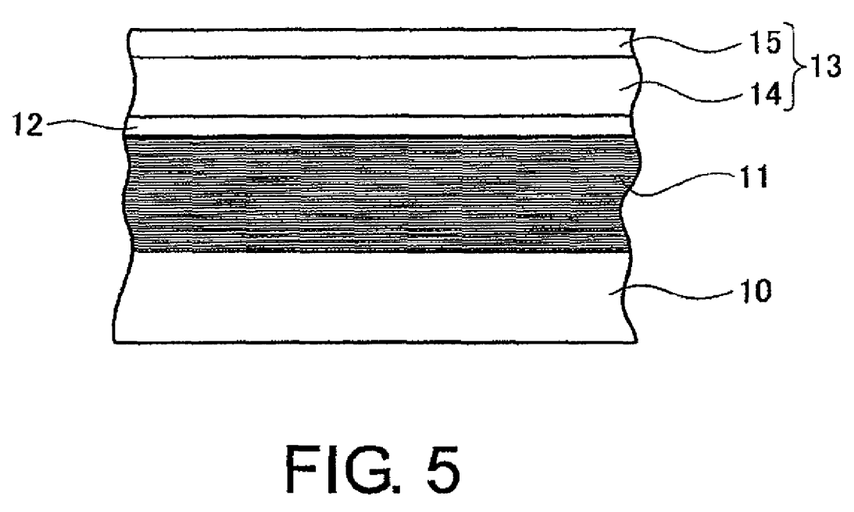
FIG. 5 is a sectional view illustrating the structure of a reflective photomask blank according to Example 3 of this invention.

FIG. 5 is a sectional view illustrating the structure of a reflective photomask blank according to Example 3. The reflective photomask blank is a photomask blank for fabricating a reflective photomask particularly for use in extreme ultraviolet (EUV) lithography using EUV light (wavelength: about 13 nm). The reflective photomask blank is formed by stacking a multilayer reflective film 11, an intermediate film 12, and an absorbent film (light-shielding film) 13 in this order on a substrate 10. The multilayer reflective film 11 is a film adapted to reflect EUV light with high reflectance and normally has a structure in which a material having a relatively high refractive index and a material having a relatively low refractive index are alternately layered in the order of several nm. As the multilayer reflective film 11, use is widely made of a Mo/Si cycle multilayer reflective film in which Mo and Si are alternately layered by approximately 40 cycles. As examples of other multilayer reflective films, there are a Ru/Si cycle multilayer reflective film, a Mo/Be cycle multilayer reflective film, a Mo compound/Si compound cycle multilayer reflective film, a Si/Nb cycle multilayer reflective film, a Si/Mo/Ru cycle multilayer reflective film, a Si/Mo/Ru/Mo cycle multilayer reflective film, a Si/Ru/Mo/Ru cycle multilayer reflective film, and so on.

The intermediate film 12 serves as an etching stopper in etching a transfer pattern in the absorbent film 13 and is generally a film of a material containing Cr as a main metal component. Particularly, CrN is preferable because it has an amorphous crystal structure and thus the edge roughness can be made small when the transfer pattern is etched. A protective film mainly containing Ru and having an etching stopper function in etching the transfer pattern in the absorbent film 13 may be provided instead of the intermediate film 12 or between the multilayer reflective film 11 and the intermediate film 12. This protective film has a high transmittance for EUV light and thus, as different from the intermediate film 12, there is no particular need to etch the transfer pattern therein. As a material applicable to this protective film, there are a Ru metal, a RuNb alloy, a RuZr alloy, compounds of them, and so on. The absorbent film 13 serves to absorb EUV light and is often made of a material containing Ta as a main metal component. By forming the transfer pattern in the absorbent film 13 and the intermediate film 12 of the reflective photomask blank with the above structure by dry etching using a resist pattern as a mask, a reflective photomask with the transfer pattern is fabricated. Then, by setting this reflective photomask at a predetermined position in an EUV exposure apparatus and irradiating EUV light thereto, the EUV light is reflected at a portion where the multilayer reflective film 11 is exposed due to the etching of the absorbent film 13 and the intermediate film 12, while, the EUV light is absorbed at a portion where the absorbent film 13 remains, so that the transfer pattern is transferred onto an exposure object such as a resist on a wafer.

Generally, after fabricating the reflective photomask by forming the transfer pattern in the absorbent film 13 and the intermediate film 12 of the reflective photomask blank, inspection is conducted for examining the accuracy of the transfer pattern. The inspection is carried out by irradiating deep ultraviolet light having a wavelength of about 190 nm to 260 nm onto the reflective photomask and observing reflection contrast. If the surface reflectance of the absorbent film 13 is high, the difference in reflection contrast between the surface of the multilayer reflective film 11 and the surface of the absorbent film 13 becomes so small that the inspection cannot be carried out satisfactorily. Therefore, the absorbent film 13 has a two-layer structure comprising, from the intermediate film 12 side, an absorbent layer (light-shielding layer) 14 made of a material having a high absorptivity for EUV light and a surface antireflection layer 15 made of a material having a low reflectance for inspection light (deep ultraviolet light). In the case where a material containing Ta as a main metal component is used as the absorbent layer 14, Ta nitride is preferable as the absorbent layer 14 and Ta oxide is preferable as the surface antireflection layer 15.

Also in the case of the reflective photomask blank, as in the case of the conventional photomask blank for use in ArF exposure, a problem has arisen that the film stress in the two-layer structure comprising the Ta nitride absorbent layer 14 and the Ta oxide surface antireflection layer 15 of the absorbent film 13 affects deformation of the multilayer reflective film 11 and the substrate 10. The technical idea of this invention is also applicable to the absorbent film 13 of the reflective photomask blank.

Hereinbelow, referring to FIG. 5, a manufacturing method of the reflective photomask blank according to Example 3 will be described. In the reflective photomask blank according to Example 3, a SiO$_2$—TiO$_2$ glass having an about 152 mm×152 mm square size with a thickness of 6.35 mm was used as a substrate 10. At first, a multilayer reflective film 11 was formed on the substrate 10 by ion beam sputtering. The substrate 10 was placed in an ion beam sputtering apparatus provided therein with a Si target and a Mo target, then an ion beam was alternately irradiated onto the Si target and the Mo target to layer Si and Mo by 40 cycles, each cycle having a Si film (4.2 nm)/a Mo film (2.8 nm), and finally, a Si film was formed to a thickness of 4.2 nm, thereby forming the multilayer reflective film 11. Then, an intermediate film 12 of Cr nitride was formed to a thickness of 15 nm on an upper surface of the multilayer reflective film 11 in a DC magnetron sputtering apparatus. The film formation was carried out using a Cr target and using, as a sputtering introduction gas (sputtering gas), Ar added with 10 at % N.

Then, an absorbent layer 14 of Ta—B—N (nitride of tantalum-boron alloy) was formed on an upper surface of the intermediate film 12 in the DC magnetron sputtering apparatus. After the inside of the sputtering apparatus was evacuated to $2\times10^{-5}$ (Pa) or less, a mixed gas (sputtering gas) of Xe and N$_2$ was introduced into the sputtering apparatus. In this event, the flow rate of Xe and the flow rate of N$_2$ were adjusted to 12.9 sccm and 6 sccm, respectively. A Ta—B alloy (Ta:B=80:20 atomic ratio) was used as a sputtering target. After the gas flow rates were stabilized, the power of a DC power supply was set to 1.5 kW, thereby forming the Ta—B—N absorbent layer 14 having a thickness of 50 nm on the upper surface of the intermediate film 12.

Then, while the substrate 10 was maintained in the sputtering apparatus, a mixed gas (sputtering gas) containing Ar at a flow rate of 58 sccm and O$_2$ at a flow rate of 32.5 sccm was introduced into the sputtering apparatus and then the power of the DC power supply was set to 0.7 kW, thereby forming a surface antireflection layer 15 of Ta—B—O (oxide of tantalum-boron alloy) having a thickness of 15 nm on the absorbent layer 14. When forming the Ta—B—O surface antireflection layer 15 by DC magnetron sputtering, it may happen that an oxide film is deposited on the sputtering target to reduce the film forming rate. For suppressing the reduction in film forming rate, a DC pulse unit is effective. Also in this Example, use was made of Sparc-LE V (trade name) manufactured by Advanced Energy Industries, Inc.

In the fabricated reflective photomask blank, the absorbent layer 14 and the surface antireflection layer 15 were both in an amorphous crystal state. Further, XPS analysis was performed for an absorbent film 13, wherein the N content and the Xe content of the Ta—B—N absorbent layer 14 were 15 at % and about 0.3 at %, respectively, and the O content of the Ta—B—O surface antireflection layer 15 was 56 at %. Further, RBS analysis was performed and the Ar content in the Ta—B—O surface antireflection layer 15 was about 0.1 at %. Further, the surface roughness in a 1 μm square area of the absorbent film 13 was measured using an AFM and the value of Rms was 0.42 nm.

The manufacturing conditions and so on of the absorbent film 13 of Example 3 are collectively shown in Table 9.

TABLE 9

| Configuration of Example 3 | Material | Thickness (nm) | Introduced Gas during Sputtering | | | |
|---|---|---|---|---|---|---|
| | | | Xe (sccm) | Ar (sccm) | N$_2$ (sccm) | O$_2$ (sccm) |
| Front-Surface Antireflection Layer | Ta—B—O | 15 | 0 | 58 | 0 | 32.5 |
| Light-Shielding Layer | Ta—B—N | 50 | 12.9 | 0 | 6 | 0 |

With respect to the photomask blank thus fabricated, the deformation amount of the substrate 10 in the cross-sectional direction was measured before and after the formation of the absorbent film 13. The measurement of the deformation amount of the substrate 10 was performed in a 142 mm square area excluding the outer peripheral portion of the 152 mm square substrate 10. As a result, the upper surface of the substrate 10 was deformed by 0.01 μm in the convex direction due to the formation of the absorbent film 13.

Then, an electron-beam resist was coated to a thickness of 150 nm on the surface antireflection layer 15 of the absorbent film 13 formed on the substrate 10 and then a pattern is transferred into the absorbent film 13 through the same etching process as in Example 1. Subsequently, the pattern is transferred into the Cr nitride intermediate film 12 by dry etching using a mixed gas of a $Cl_2$ gas and an $O_2$ gas, thereby obtaining a reflective photomask. The reflective photomask thus obtained was set in an EUV exposure apparatus to thereby carry out pattern transfer onto a wafer coated with a resist. As a result, the transferred pattern offset amount from a design pattern on the resist of the wafer due to defocus or the like satisfied the accuracy required for half-pitch 32 nm or less fine pattern exposure. Thus, it has been found that the reflective photomask blank of Example 3 has sufficient performance in half-pitch 32 nm or less fine pattern exposure. If the protective film of, for example, a RuNb alloy is provided instead of the intermediate film 12, the protective film may be formed to a thickness of 2.5 nm using a RuNb target.

In a photomask blank for ArF exposure light, for the purpose of reducing the back-surface reflectance while further reducing the entire thickness of a light-shielding film, the light-shielding film may have a three-layer structure in which a back-surface antireflection layer is further provided between a light-shielding layer and a transparent substrate. In this case, the back-surface antireflection layer preferably contains tantalum nitride (TaN) as a main component. Consequently, the light-shielding film has a three-layer structure comprising a front-surface antireflection layer mainly containing TaO and having tensile stress, a light-shielding layer mainly containing TaN and having compressive stress, and a back-surface antireflection layer mainly containing TaN and having compressive stress. Thus, it is preferable to use a Xe gas as a noble gas in sputtering for the two layers mainly containing TaN and to adjust film stresses of the three layers by adjusting the film forming conditions, thereby causing the substrate deformation amount of the fabricated photomask blank to fall within an allowable range.

A photomask according to this invention can be used as a mask in, for example, forming a fine pattern by photolithography in the manufacture of semiconductor devices, and a photomask blank according to this invention can be used as a photomask blank serving as an intermediate product that can be formed into a photomask by applying certain treatments thereto.

While the invention made by the present inventor has been described in detail based on the Examples, it is needless to say that this invention is not limited thereto, but various changes may be made within the scope not departing from the gist of the invention.

What is claimed is:

1. A reflective mask blank having, on a substrate, a multilayer reflective film and an absorber film comprising at least two layers,
   wherein the absorber film comprises:
      an absorber layer made of a material mainly containing tantalum nitride and further containing xenon, the absorber layer is formed by sputtering using a sputtering target made of tantalum or a material mainly containing tantalum and using a mixed gas of a xenon gas and a nitrogen-based gas as a sputtering gas; and
      a surface antireflection layer formed on the absorber layer, the surface antireflection layer being made of a material mainly containing tantalum oxide and further containing argon, the surface antireflection layer is formed by sputtering using a sputtering target made of tantalum or a material mainly containing tantalum and using a mixed gas of an argon gas and an oxygen-based gas as a sputtering gas,
   wherein the absorber layer has a compressive stress while the surface antireflection layer has a tensile stress, and
   the compressive stress and the tensile stress are cancelled by each other to reduce an internal stress of the absorber film as a whole.

2. The reflective mask blank according to claim 1, wherein the absorber layer or the surface antireflection layer is made of a material containing boron.

3. A reflective mask wherein a transfer pattern is formed in the absorber film of the reflective mask blank according to claim 1 or 2.

4. A method of manufacturing a reflective mask in which a transfer pattern is formed in the absorber film of the reflective mask blank according to claim 1 or 2, comprising:
   dry-etching the surface antireflection layer with a fluorine-based gas containing substantially no oxygen using, as an etching mask, a resist film having the transfer pattern; and
   after dry-etching the surface antireflection layer, dry-etching the absorber layer with a chlorine-based gas containing substantially no oxygen using, as an etching mask, at least one of the resist film and the surface antireflection layer.

5. The reflective mask blank according to claim 1, wherein the xenon is higher in atomic weight than the argon so that the xenon serves to reduce the compressive stress of the absorber layer.

6. The reflective mask blank according to claim 1, wherein reflective mask blank satisfies an accuracy required for half-pitch 32 nm or less fine pattern exposure.

7. A method of manufacturing a reflective mask blank having a multilayer reflective film on a substrate, the method comprising:
   forming, on the multilayer reflective film, an absorber layer made of a material mainly containing tantalum nitride, by sputtering using a sputtering target made of tantalum or a material mainly containing tantalum and using a mixed gas of a xenon gas and a nitrogen-based gas as a sputtering gas; and
   forming, on the absorber layer, a surface antireflection layer made of a material mainly containing tantalum oxide, by sputtering using the sputtering target made of tantalum or the material mainly containing tantalum and using a mixed gas of an argon gas and an oxygen-based gas as a sputtering gas,
   wherein the absorber layer has a compressive stress while the surface antireflection layer has a tensile stress, and
   the compressive stress and the tensile stress are cancelled by each other to reduce an internal stress of an absorber film as a whole, the absorber film comprising the absorber layer and the surface antireflection layer.

8. The method according to claim 7, wherein the xenon is higher in atomic weight than the argon so that the xenon serves to reduce the compressive stress of the absorber layer.

9. The method according to claim 7, wherein the reflective mask blank satisfies an accuracy required for half-pitch 32 nm or less fine pattern exposure.

10. A method of manufacturing a reflective mask blank having a multilayer reflective film on a substrate, the method comprising:

forming, on the multilayer reflective film, an absorber layer made of a material mainly containing tantalum nitride, by sputtering using a sputtering target made of a sintered body of tantalum and boron, and using a mixed gas of a xenon gas and a nitrogen-based gas as a sputtering gas; and forming, on the absorber layer, a surface antireflection layer made of a material mainly containing tantalum oxide, by sputtering using the sputtering target made of the sintered body of tantalum and boron, and using a mixed gas of an argon gas and an oxygen-based gas as a sputtering gas, wherein the absorber layer has a compressive stress while the surface antireflection layer has a tensile stress, and the compressive stress and the tensile stress are cancelled by each other to reduce an internal stress of an absorber film as a whole, the absorber film comprising the absorber layer and the surface antireflection layer.

11. The method according to claim 10, wherein the xenon is higher in atomic weight than the argon so that the xenon serves to reduce the compressive stress of the absorber layer.

12. The method according to claim 10, wherein the reflective mask blank satisfies an accuracy required for half-pitch 32 nm or less fine pattern exposure.

13. A reflective mask blank having, on a substrate, a multilayer reflective film and a layered film comprising at least two layers, wherein the layered film comprises:

a first layer made of a material mainly containing tantalum nitride and further containing xenon, the first layer is formed by sputtering using a sputtering target made of tantalum or a material mainly containing tantalum and using a mixed gas of a xenon gas and a nitrogen-based gas as a sputtering gas; and a second layer formed on the first layer, the second layer being made of a material mainly containing tantalum oxide and further containing argon, the second layer is formed by sputtering using a sputtering target made of tantalum or a material mainly containing tantalum and using a mixed gas of an argon gas and an oxygen-based gas as a sputtering gas, wherein the first layer has a compressive stress while the second layer has a tensile stress, and the compressive stress and the tensile stress are cancelled by each other to reduce an internal stress of the layered film as a whole.

14. The reflective mask blank according to claim 13, wherein the first layer or the second layer is made of a material containing boron.

15. A reflective mask wherein a transfer pattern is formed in the layered film of the reflective mask blank according to claim 13.

16. A method of manufacturing a reflective mask in which a transfer pattern is formed in the layered film of the reflective mask blank according to claim 13, comprising:

dry-etching the second layer with a fluorine-based gas containing substantially no oxygen using, as an etching mask, a resist film having the transfer pattern; and after dry-etching the second layer, dry-etching the first layer with a chlorine-based gas containing substantially no oxygen using, as an etching mask, at least one of the resist film and the second layer.

17. The reflective mask blank according to claim 13, wherein the xenon is higher in atomic weight than the argon so that the xenon serves to reduce the compressive stress of the first layer.

18. The reflective mask blank according to claim 13, wherein the reflective mask blank satisfies an accuracy required for half-pitch 32 nm or less fine pattern exposure.

19. A method of manufacturing a reflective mask blank having a multilayer reflective film on a substrate, the method comprising:

forming, on the multilayer reflective film, a first layer made of a material mainly containing tantalum nitride, by sputtering using a sputtering target made of tantalum or a material mainly containing tantalum and using a mixed gas of a xenon gas and a nitrogen-based gas as a sputtering gas; and forming, on the first layer, a second layer made of a material mainly containing tantalum oxide, by sputtering using the sputtering target made of tantalum or the material mainly containing tantalum and using a mixed gas of an argon gas and an oxygen-based gas as a sputtering gas, wherein the first layer has a compressive stress while the second layer has a tensile stress, and the compressive stress and the tensile stress are cancelled by each other to reduce an internal stress of a layered film as a whole, the layered film comprising the first layer and the second layer.

20. The method according to claim 19, wherein the xenon is higher in atomic weight than the argon so that the xenon serves to reduce the compressive stress of the first layer.

21. The method according to claim 19, wherein the reflective mask blank satisfies an accuracy required for half-pitch 32 nm or less fine pattern exposure.

22. A method of manufacturing a reflective mask blank having a multilayer reflective film on a substrate, the method comprising:

forming, on the multilayer reflective film, a first layer made of a material mainly containing tantalum nitride, by sputtering using a sputtering target made of a sintered body of tantalum and boron, and using a mixed gas of a xenon gas and a nitrogen-based gas as a sputtering gas; and forming, on the first layer, a second layer made of a material mainly containing tantalum oxide, by sputtering using the sputtering target made of the sintered body of tantalum and boron, and using a mixed gas of an argon gas and an oxygen-based gas as a sputtering gas, wherein the first layer has a compressive stress while the second layer has a tensile stress, and the compressive stress and the tensile stress are cancelled by each other to reduce an internal stress of a layered film as a whole, the layered film comprising the first layer and the second layer.

23. The method according to claim 22, wherein the xenon is higher in atomic weight than the argon so that the xenon serves to reduce the compressive stress of the first layer.

24. The method according to claim 22, wherein the reflective mask blank satisfies an accuracy required for half-pitch 32 nm or less fine pattern exposure.

* * * * *